US012623255B2

(12) United States Patent
Kwon et al.

(10) Patent No.: US 12,623,255 B2
(45) Date of Patent: May 12, 2026

(54) SUBSTRATE CLEANING DEVICE AND SUBSTRATE CLEANING METHOD

(71) Applicant: Samsung Electronics Co., Ltd., Suwon-si (KR)

(72) Inventors: Donghoon Kwon, Suwon-si (KR); Juhyun Lee, Suwon-si (KR); Chungki Min, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 170 days.

(21) Appl. No.: 18/307,526

(22) Filed: Apr. 26, 2023

(65) Prior Publication Data

US 2024/0082881 A1 Mar. 14, 2024

(30) Foreign Application Priority Data

Aug. 17, 2022 (KR) ........................ 10-2022-0102781

(51) Int. Cl.

| | |
|---|---|
| ***B08B 1/12*** | (2024.01) |
| ***B08B 1/20*** | (2024.01) |
| ***B08B 3/02*** | (2006.01) |
| ***B08B 3/08*** | (2006.01) |
| ***B24B 53/017*** | (2012.01) |
| ***C08L 29/04*** | (2006.01) |
| ***C08L 39/02*** | (2006.01) |
| ***C08L 39/04*** | (2006.01) |
| ***C08L 39/06*** | (2006.01) |
| ***C08L 71/02*** | (2006.01) |

(Continued)

(52) U.S. Cl.

CPC .................. *B08B 1/12* (2024.01); *B08B 1/20* (2024.01); *B08B 3/022* (2013.01); *B08B 3/08* (2013.01); *B24B 53/017* (2013.01); *H01L 21/02065* (2013.01); *H01L 21/02074* (2013.01); *H01L 21/76819* (2013.01); *H01L 21/7684* (2013.01)

(58) Field of Classification Search

CPC .. B08B 1/12; B08B 1/20; B08B 3/022; B08B 3/08; B24B 53/017; H01L 21/02065; H01L 21/02074; H01L 21/76819; H01L 21/7684; H01L 21/67046; H01L 21/67051; C08L 29/04; C08L 39/02; C08L 39/04; C08L 39/06; C08L 71/02; C08L 79/02; C08L 101/16

See application file for complete search history.

(56) References Cited

U.S. PATENT DOCUMENTS 8,555,458 B2 10/2013 Kawaguchi et al.
9,211,568 B2 12/2015 Chang (Continued)

FOREIGN PATENT DOCUMENTS

KR 2004/0070591 A 8/2004

*Primary Examiner* — Michael E Barr
*Assistant Examiner* — Lauren G Orta
(74) *Attorney, Agent, or Firm* — HARNESS, DICKEY & PIERCE, P.L.C.

(57) ABSTRACT

A substrate cleaning apparatus may include a first roll member and a second roll member including a copolymer of a first water-soluble polymer and a second water-soluble polymer. The first roll member may include a first roll body extending in a first direction and first protrusions on a surface of the first roll body. The second roll member may include a second roll body extending in the first direction and second protrusions on a surface of the second roll body.

13 Claims, 5 Drawing Sheets

(51) Int. Cl.

| | |
|---|---|
| ***C08L 79/02*** | (2006.01) |
| ***C08L 101/16*** | (2006.01) |
| ***H01L 21/02*** | (2006.01) |
| ***H01L 21/67*** | (2006.01) |
| ***H01L 21/768*** | (2006.01) |

(56) References Cited

U.S. PATENT DOCUMENTS

| | | | |
|---|---|---|---|
| 2002/0006767 | A1 | 1/2002 | Wang et al. |
| 2003/0061675 | A1* | 4/2003 | Sugarman ......... H01L 21/67046 15/77 |
| 2005/0092350 | A1 | 5/2005 | Buehler |
| 2005/0155630 | A1* | 7/2005 | Kilkenny ................ A61L 2/186 15/104.94 |
| 2007/0224811 | A1* | 9/2007 | Wang ................ H01L 21/67046 257/E21.174 |
| 2013/0048018 | A1 | 2/2013 | Wargo et al. |
| 2016/0056060 | A1* | 2/2016 | Doi ................... H01L 21/02096 15/160 |
| 2019/0168265 | A1* | 6/2019 | White ....................... B08B 1/12 |
| 2021/0274926 | A1* | 9/2021 | Bajaj ..................... B29C 64/124 |
| 2021/0379725 | A1* | 12/2021 | Sridhar .................. B33Y 70/00 |

* cited by examiner

SUBSTRATE CLEANING DEVICE AND SUBSTRATE CLEANING METHOD

CROSS-REFERENCE TO RELATED APPLICATION

This application claims the priority and benefit of Korean Patent Application No. 10-2022-0102781, filed on Aug. 17, 2022 with the Korean Intellectual Property Office, the entire contents of which are incorporated herein by reference.

BACKGROUND

1. Field

Inventive concepts relate to a substrate cleaning apparatus and a substrate cleaning method.

2. Description of Related Art

In order to form microstructures (e.g., a metal film, a barrier film, an insulating film, or the like) on a substrate (e.g., a semiconductor wafer), a planarization process of polishing and cleaning a surface of the substrate using a substrate processing apparatus may be used. Abrasive residues (e.g., slurry residues, abrasive debris, or the like) may be present in a roll member for scrub cleaning a surface of the polished substrate, which may cause deterioration of a cleaning effect.

SUMMARY

An aspect of inventive concepts is to provide a substrate cleaning apparatus having improved cleaning ability and a substrate cleaning method using the same.

According to an embodiment of inventive concepts, a substrate cleaning apparatus may include a first roll member and a second roll member including a copolymer of a first water-soluble polymer and a second water-soluble polymer. The first roll member may include a first roll body extending in a first direction and first protrusions on a surface of the first roll body. The second roll member may include a second roll body extending in the first direction and second protrusions on a surface of the second roll body.

According to an embodiment of inventive concepts, a substrate cleaning apparatus may include a first roll member including a first roll body extending in a first direction and first protrusions on a surface of the first roll body; a second roll member including a second roll body extending in the first direction and second protrusions on a surface of the second roll body; and a cleaning solution supply nozzle. The cleaning solution supply nozzle may be configured to supply a cleaning solution to a lower surface of a substrate or an upper surface of the substrate when the substrate is positioned between the first roll member and the second roll member. The first roll member and the second roll member each may include a copolymer of polyvinyl alcohol and polyvinylamine.

According to an embodiment of inventive concepts, a substrate cleaning method may include preparing a substrate having an upper surface opposite a lower surface; contacting a first roll member and a second roll member to the lower surface and the upper surface of the substrate, respectively, the first roll member and the second roll member each including a copolymer of a first water-soluble polymer and a second water-soluble polymer; and scrub cleaning the lower surface of the substrate and the upper surface of the substrate by rotating the first roll member and the second roll member. The scrub cleaning may include supplying a cleaning solution to the upper surface of the substrate and the lower surface of the substrate.

BRIEF DESCRIPTION OF DRAWINGS

The above and other aspects, features, and advantages of inventive concepts will be more clearly understood from the following detailed description taken in conjunction with the accompanying drawings, in which.

DETAILED DESCRIPTION

Hereinafter, example embodiments of inventive concepts will be described with reference to the accompanying drawings as follows.

Figure 1:
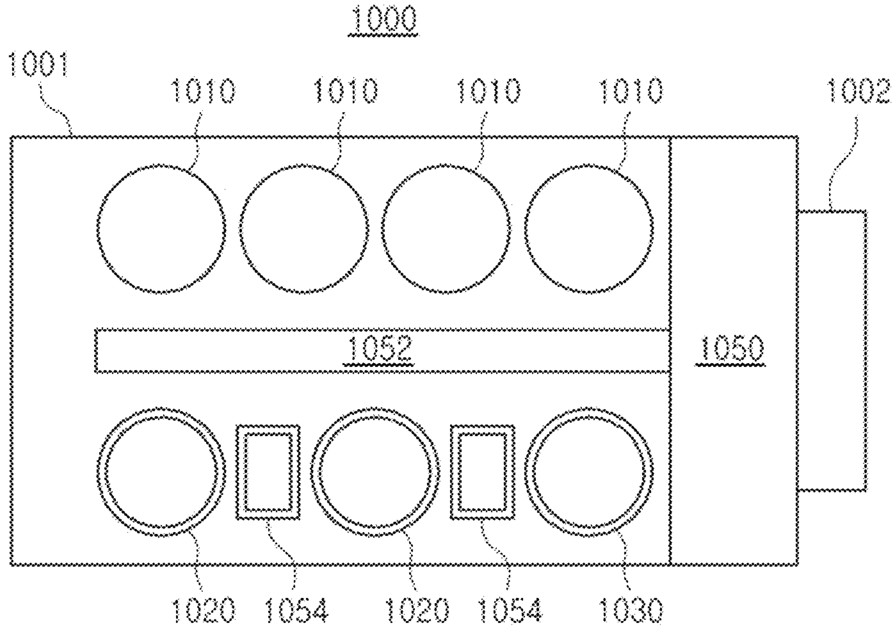
FIG. 1 is a view illustrating an example of a substrate processing apparatus to which a substrate cleaning apparatus according to inventive concepts is introduced.

FIG. 1 is a diagram illustrating an example of a substrate processing apparatus 1000 to which a substrate cleaning apparatus according to inventive concepts is introduced.

Referring to FIG. 1, the substrate processing apparatus 1000 may include a housing 1001 and a load port 1002 in which a substrate cassette for stocking a substrate such as a plurality of semiconductor wafers, or the like is loaded. The load port 1002 is disposed adjacent the housing 1001. The load port 1002 may be provided with an open cassette, a Standard Manufacturing Interface (SMIF) pod, or a Front Opening Unified Pod (FOUP). The SMIF pod and the FOUP may accommodate the substrate cassette therein, and cover an inside with a partition wall, thereby sealing the inside from an external environment.

A plurality of polishing modules 1010 (four polishing modules in this example), at least one substrate cleaning module 1020 (two substrate cleaning modules in this example) for cleaning a substrate after polishing, and a substrate drying module 1030 for drying a substrate may be accommodated inside the housing 1001. The polishing module 1010, the substrate cleaning module 1020, and the substrate drying module 1030 may be arranged along a length direction of the substrate processing apparatus 1000, but an example embodiment thereof is not limited thereto.

A substrate transfer robot 1050 may be disposed inside the housing 1001, adjacent to the load port 1002. For example, a first substrate transfer robot 1052 may be disposed in parallel to an arrangement direction of the polishing module 1010. The substrate transfer robot 1050 may receive the substrate before polishing from the load port 1002 and transfer the same to the first substrate transfer robot 1052, and receive the substrate after drying from the substrate drying module 1030, and return the same to the load port 1002.

The substrate cleaning module 1020 may include a plurality of substrate cleaning modules 1020 disposed on an opposite side of the polishing module 1010. For example, the substrate cleaning module 1020 may be provided as a first substrate cleaning module (left side, 1020) and a second substrate cleaning module (right side, 1020) arranged in parallel. A second substrate transfer robot 1054, for transferring the cleaned substrate, may be disposed between the first substrate cleaning module (left side, 1020) and the second substrate cleaning module (right side, 1020) and between the second substrate cleaning module (right side, 1020) and the substrate drying module 1030. The substrate cleaning module 1020 may further include components such as a roll holder for supporting and moving first and second roll members a roll cleaner for cleaning the first and second roll cleaners, and the like, in addition to the substrate cleaning apparatus 100 to be described later with reference to FIGS. 2A to 2B. The polishing module 1010 may include a CMP pad on a platen and may be used to perform a CMP process on a substrate (e.g., a semiconductor wafer). After the CMP process is performed on the wafer, the substrate transfer robot 1050 may transfer the substrate to the substrate cleaning module 1020 and the substrate cleaning module 1020 may perform a substrate cleaning method on the substrate.

Figure 2A:
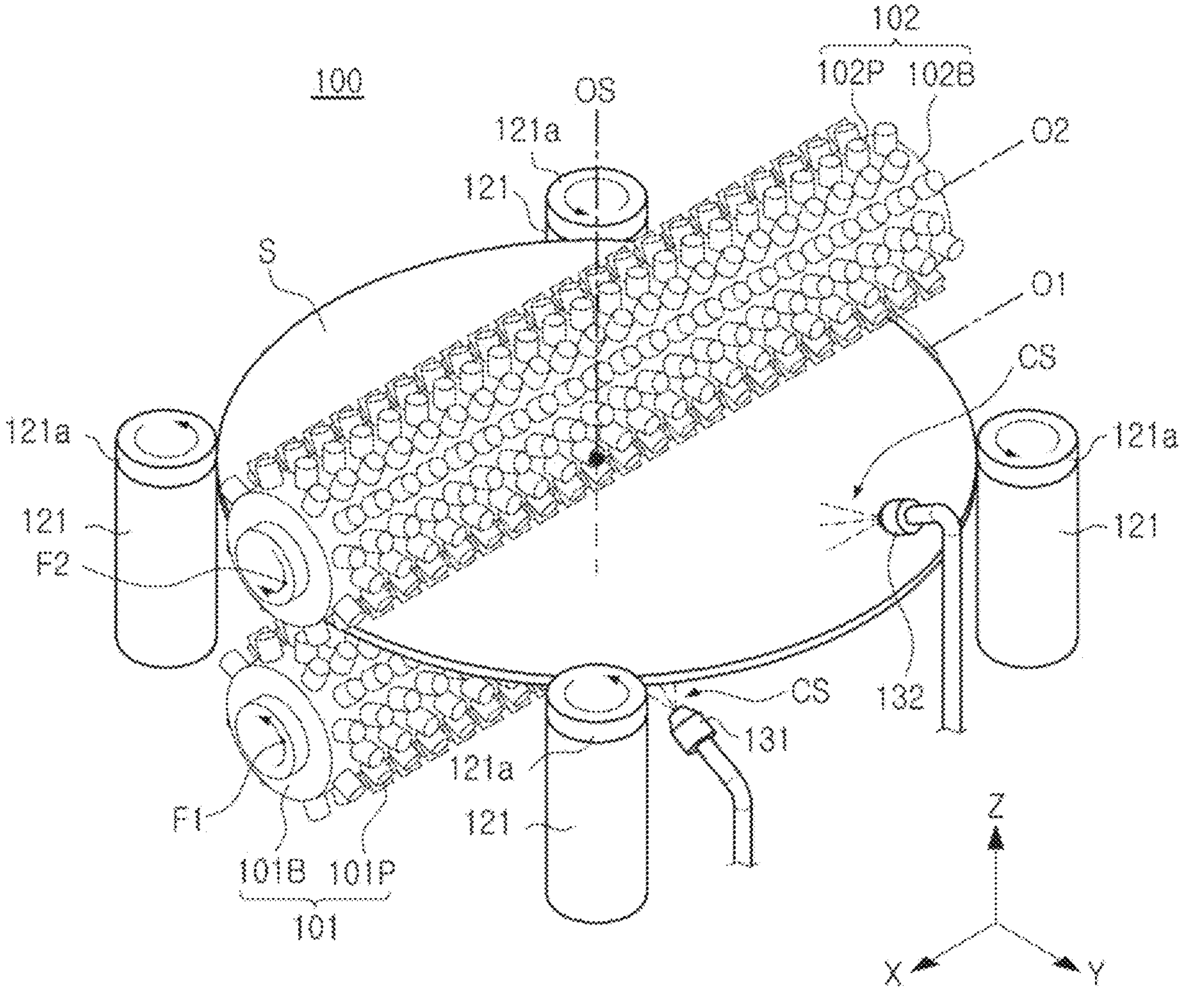
FIG. 2A is a perspective view schematically illustrating a substrate cleaning apparatus according to an example embodiment of inventive concepts.
Figure 2B:
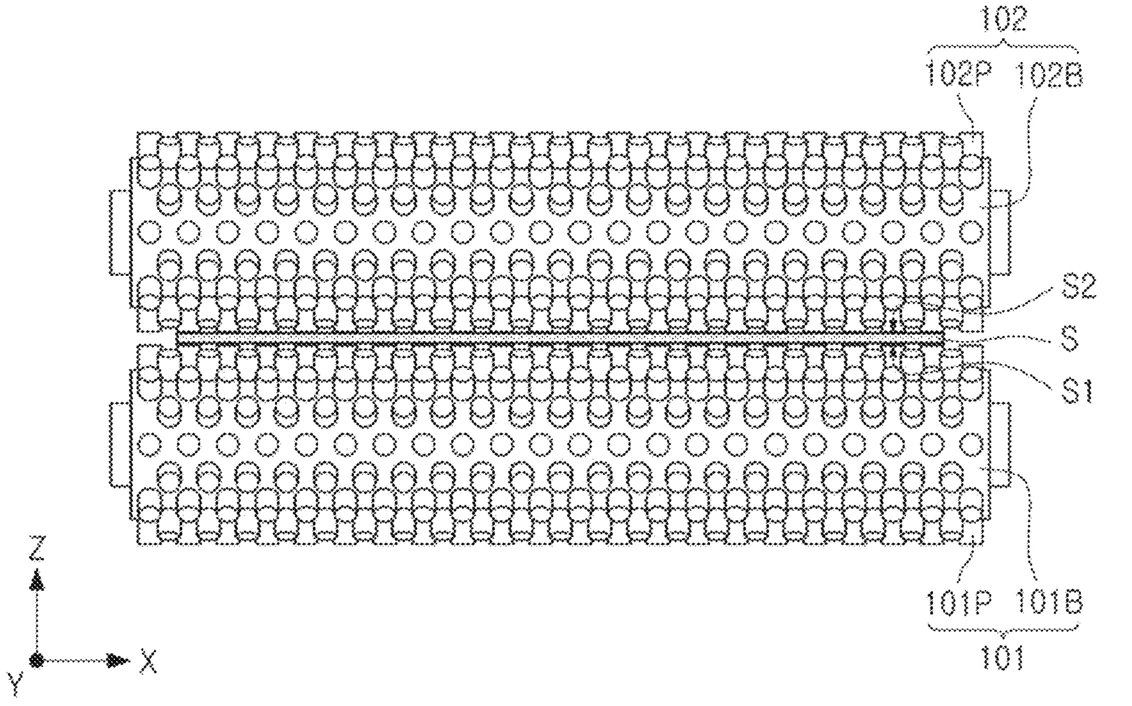
FIG. 2B is a front view illustrating the first and second roll members of FIG. 2A.

FIG. 2A is a perspective view schematically illustrating a substrate cleaning apparatus 100 according to an example embodiment of inventive concepts, and FIG. 2B is a front view illustrating the first roll member 101 and the second roll member 102 of FIG. 2A.

Referring to FIGS. 2A and 2B, the substrate cleaning apparatus 100 according to an example embodiment may include a first roll member 101, rotatably supported by a lower roll holder (not illustrated) and a second roll member 102, rotatably supported by an upper roll holder (not illustrated). According to an example embodiment, the substrate cleaning apparatus 100 may further include cleaning solution supply nozzles 131 and 132.

The first roll member 101 and the second roll member 102 may have a circumferential shape extending in a direction parallel to a lower surface S1 or an upper surface S2 (for example, an X-direction) of the substrate S. For example, the first roll member 101 may include a first roll body 101B having a cylindrical shape and first protrusions 101P disposed on an outer circumferential surface of the first roll body 101B, and the second roll member 102 may include a second roll body 102B having a cylindrical shape and second protrusions 102P disposed on an outer circumferential surface of the second roll body 102B. For example, the first roll member 101 may be disposed adjacently to the lower surface S1 of the substrate S, and the second roll member 102 may be disposed adjacently to the upper surface S2 of the substrate S. At least one surface of the substrate S may be in a state in which a polishing process is applied. For example, the upper surface S2 of the substrate S may be in a state in which a chemical-mechanical polishing (CMP) process is applied.

The first roll member 101 and the second roll member 102 have a first rotation axis O1 and a second rotation axis O2 substantially orthogonal to a central axis (e.g., a rotation center) OS of the substrate S, and may extend to cover the lower surface S1 and the upper surface S2 of the substrate S. The first roll member 101 may be configured to rotate in a first direction F1 by a rotation driving means, and the second roll member 102 may be configured to rotate in a second direction F2. In addition, the first roll member 101 may be configured to be raised and lowered with respect to the lower surface S1 of the substrate S, and the second roll member 102 may be configured to be raised and lowered with respect to the upper surface S2 of the substrate S.

For example, a substrate cleaning method using a substrate cleaning apparatus 100 of an example embodiment may include: an operation of preparing substrate S having an upper surface S2 and a lower surface S1, opposite to the upper surface S2 to which a polishing process is applied; an operation of contacting a first roll member 101 and a second roll member 102 to the lower surface S1 and the upper surface S2 of the substrate S, respectively; and an operation of supplying a cleaning solution CS to the upper surface S2 and the lower surface S1 of the substrate S, and rotating the first roll member 101 and the second roll member 102 to scrub the substrate S.

The substrate S may be supported and rotated by a spindle 121 (substrate holding means). The spindle 121 may be configured to be movable in a horizontal direction so as to be in contact or non-contact with an edge of the substrate S. The spindle 121 is a rotation mechanism of the substrate S, and may be disposed adjacent to an edge of the substrate S to support a peripheral portion of the substrate S and to rotate the substrate S horizontally. The spindle 121 may include a plurality of spindles 121 (four spindles in FIG. 2A) adjacent to the edge of the substrate S. For example, the peripheral portion of the substrate S to which a polishing process is applied is positioned and pressed in a fitting groove formed on an outer peripheral side surface of a coma 121*a* installed above the spindle 121, and the coma 121*a* may be rotated (self-rotated), so that the substrate S can be rotated horizontally. According to example embodiments, two comas 121*a* among the four comas 121*a* impart rotational force to the substrate S, and the other two comas 121*a* may act as a bearing receiving rotational force of the substrate S. Alternatively, all of the comas 121*a* may be connected to a driving mechanism to impart rotational force to the substrate S.

The cleaning solution supply nozzles 131 and 132 may be configured to supply a cleaning solution and/or a rinse solution to a surface of the substrate S. For example, an upper cleaning solution supply nozzle 132 for supplying a cleaning solution to an upper surface S2 of the substrate S may be disposed above the substrate S. A lower cleaning solution supply nozzle 131 for supplying a cleaning solution to a lower surface S1 of the substrate S may be disposed below the substrate S. The lower cleaning solution supply nozzle 131 and the upper cleaning solution supply nozzle 132 may supply a cleaning solution and/or a rinse solution to the lower surface S1 and the upper surface S2 of the substrate S, respectively.

For example, in a state in which the substrate S is horizontally rotated, a cleaning solution and/or a rinse solution may be supplied from the lower cleaning solution supply nozzle 131 and the upper cleaning solution supply nozzle 132. In addition, the second roll member 102 may be rotated and lowered to contact the upper surface S2 of the substrate S, rotating, and the first roll member 101 may be rotated and lowered to contact the lower surface S1 of the substrate S, rotating, so that the upper surface S2 and the lower surface S1 of the substrate S may be scrub-cleaned.

Abrasive residues on the substrate S by scrub cleaning, for example, residues of a slurry used in a polishing process, debris of an object to be polished, and the like, may reverse-contaminate the first roll member 101 and the second roll member 102. The slurry residue may include, for example, ceria, silica, alumina, zirconia, and the like. Debris of the object to be polished may include, for example, silicon, polysilicon, silicon oxide, silicon nitride, a metal forming an interconnection, or a plug, and the like.

In embodiments of inventive concepts, by introducing a first roll member 101 and a second roll member 102 including a copolymer having a zeta potential controlled, rear contamination of the first roll member 101 and the second roll member 102 by abrasive residues may be limited and/or prevented. The first roll member 101 and the second roll member 102 of inventive concepts may include a copolymer including two or more water-soluble polymers. For example, the first roll member 101 and the second roll member 102 may be formed of a copolymer including a first water-soluble polymer and a second water-soluble polymer.

The first water-soluble polymer may include a non-ionic polymer. The non-ionic polymer may include at least one of polyvinyl alcohol, polyvinyl pyrrolidone, polyethylene glycol, polypropylene glycol, and polybutylene glycol, polyethylene oxide. For example, the first water-soluble polymer may include polyvinyl alcohol having a structure of the following [Chemical Formula 1].

[Chemical Formula 1]

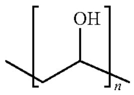

The second water-soluble polymer may include a cationic polymer for changing a zeta potential of the first water-soluble polymer. The cationic polymer may include at least one of polyvinylamine, polyethyleneimine, polyvinylimidazole, and polyallylamine. For example, the second water-soluble polymer may include polyvinylamine having a structure of the following [Chemical Formula 2].

[Chemical Formula 2]

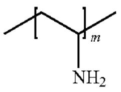

The copolymer may include at least one of a random copolymer, an alternating copolymer, a block copolymer, and a graft copolymer, composed of a first water-soluble polymer and a second water-soluble polymer.

The copolymer may be synthesized by a process such as free radical polymerization, redox initiation, or grafting, but an example embodiment thereof is not limited thereto. For example, the copolymer that may be applied to example embodiments of inventive concepts may be formed by copolymerization of vinyl ester monomers and comonomers through bulk polymerization, solution polymerization, emulsion polymerization, and suspension polymerization. The vinyl ester monomers may include, for example, various aliphatic acids such as vinyl formate, vinyl acetate, vinyl butyrate, vinyl pivalate, and vinyl versatate. The comonomers may include amine comonomers.

For example, the copolymer may include greater than 0 wt % and less than 100 wt % of polyvinyl alcohol, and greater than 0 wt % and less than 100 wt % of polyvinylamine. Alternatively, the copolymer may include greater than 0 wt % and 10 wt % or less of polyvinyl alcohol, and greater than 90 wt % and less than 100 wt % polyvinylamine. Alternatively, the copolymer may include greater than 0 wt % and 20 wt % or less of polyvinyl alcohol, and greater than 80 wt % and less than 100 wt % of polyvinylamine. Alternatively, the copolymer may include greater than 0 wt % and 30 wt % or less of polyvinyl alcohol, and greater than 70 wt % and less than 100 wt % of polyvinylamine. Alternatively, the copolymer may include greater than 0 wt % and 40 wt % or less of polyvinyl alcohol, and greater than 60 wt % and less than 100 wt % of polyvinylamine. Alternatively, the copolymer may include greater than 0 wt % and 50 wt % or less of polyvinyl alcohol, and greater than 50 wt % and less than 100 wt % of polyvinylamine. Alternatively, the copolymer may include greater than 0 wt % and 60 wt % or less of polyvinyl alcohol, and greater than 40 wt % and less than 100 wt % of polyvinylamine. Alternatively, the copolymer may include greater than 0 wt % and 70 wt % or less of polyvinyl alcohol, and greater than 30 wt % and less than 100 wt % of polyvinylamine. Alternatively, the copolymer may include greater than 0 wt % and 80 wt % or less of polyvinyl alcohol, and greater than 20 wt % and less than 100 wt % of polyvinylamine. Alternatively, the copolymer may include greater than 0 wt % and 90 wt % or less of polyvinyl alcohol, and greater than 10 wt % and less than 100 wt % of polyvinylamine.

According to embodiments of inventive concepts, the copolymer constituting the first roll member 101 and the second roll member 102 may have a zeta potential of the same polarity as that of the abrasive residue (e.g., the slurry residue) in a pH range of the cleaning solution. The copolymer may have a zeta potential of the same polarity as the slurry residue (e.g., ceria) used in the polishing process in the pH range of the cleaning solution (e.g., pH 5 or less). For example, the slurry residue (e.g., ceria) may have a zeta potential of greater than or equal to zero in the pH range of the cleaning solution, and the copolymer may have a zeta potential of greater than or equal to zero in the pH range of the cleaning solution. Accordingly, it is possible to limit and/or prevent reverse contamination of the first roll member 101 and the second roll member 102 by the slurry residue (e.g., ceria) under the pH condition of the cleaning solution.

The cleaning solution may include at least one of pure (DI water), ultrapure water, hydrofluoric acid (HF), sulfuric acid ($H_3SO_4$), nitric acid ($HNO_3$), phosphoric acid ($H3PO_4$), a standard clean-1 (SC-1) solution, an EKC solution, a LAL solution, and a diluted sulfate peroxide (DSP) solution. For example, the cleaning solution may include 100-fold diluted hydrofluoric acid (HF) having a pH in a range of 3 to 4.

Figure 3:
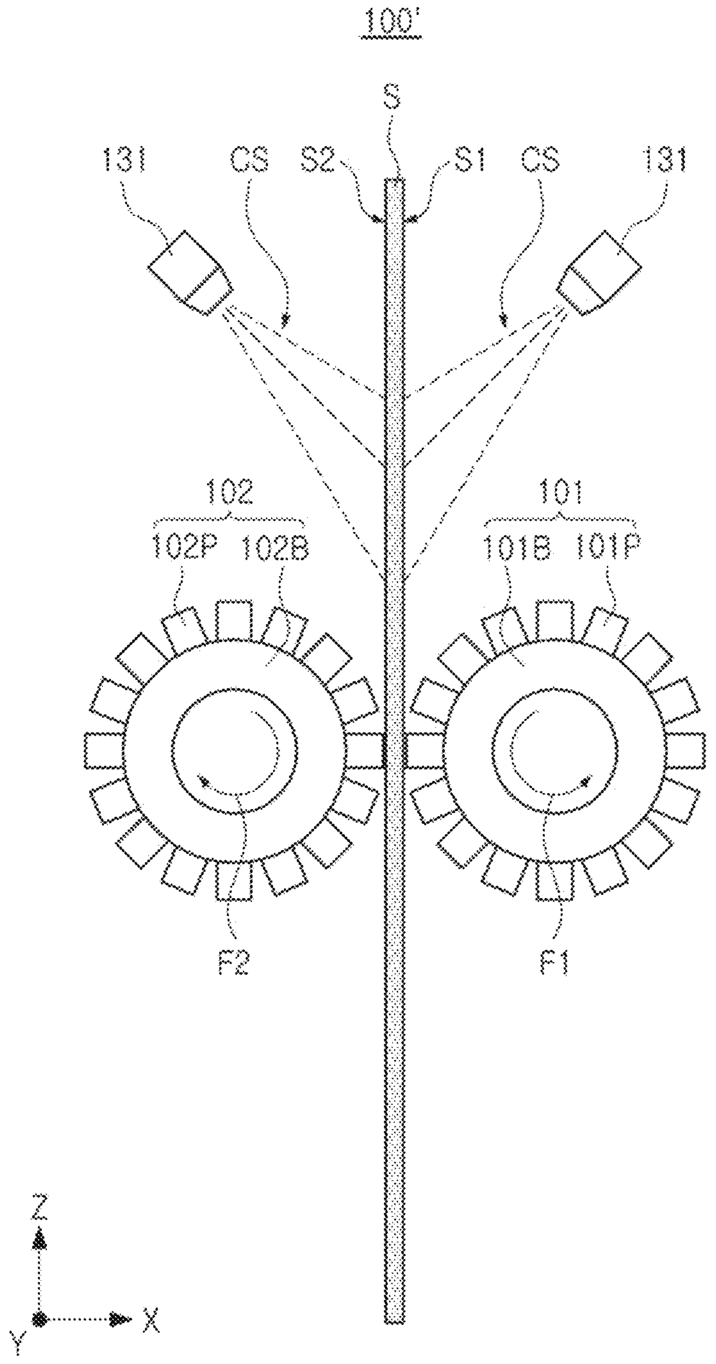
FIG. 3 is a side view schematically illustrating a substrate cleaning apparatus according to an example embodiment of inventive concepts.

FIG. 3 is a side view schematically illustrating a substrate cleaning apparatus 100' according to an example embodiment of inventive concepts.

Referring to FIG. 3, the substrate cleaning apparatus 100' may have the same or similar characteristics as those described with reference to FIGS. 1 to 2B, except for performing scrub cleaning by contacting a first roll member 101 and a second roll member 102 with both sides of a vertically erected substrate S.

The first roll member 101 and the second roll member 102 may include a copolymer of a first water-soluble polymer (e.g., polyvinyl alcohol) and a second water-soluble polymer (e.g., polyvinylamine). The copolymer constituting the first roll member 101 and the second roll member 102 has a zeta potential of the same polarity as that of a slurry residue (e.g., ceria) on a polishing surface of the substrate S in a pH range of the cleaning solution. For example, a copolymer of polyvinyl alcohol and polyvinylamine may have a zeta potential of 0 or greater at a pH in a range of about 3 to about 4. Hereinafter, a difference in zeta potential between the polymer of Comparative Example and the copolymer of Example will be described with reference to FIG. 4.

Figure 4:
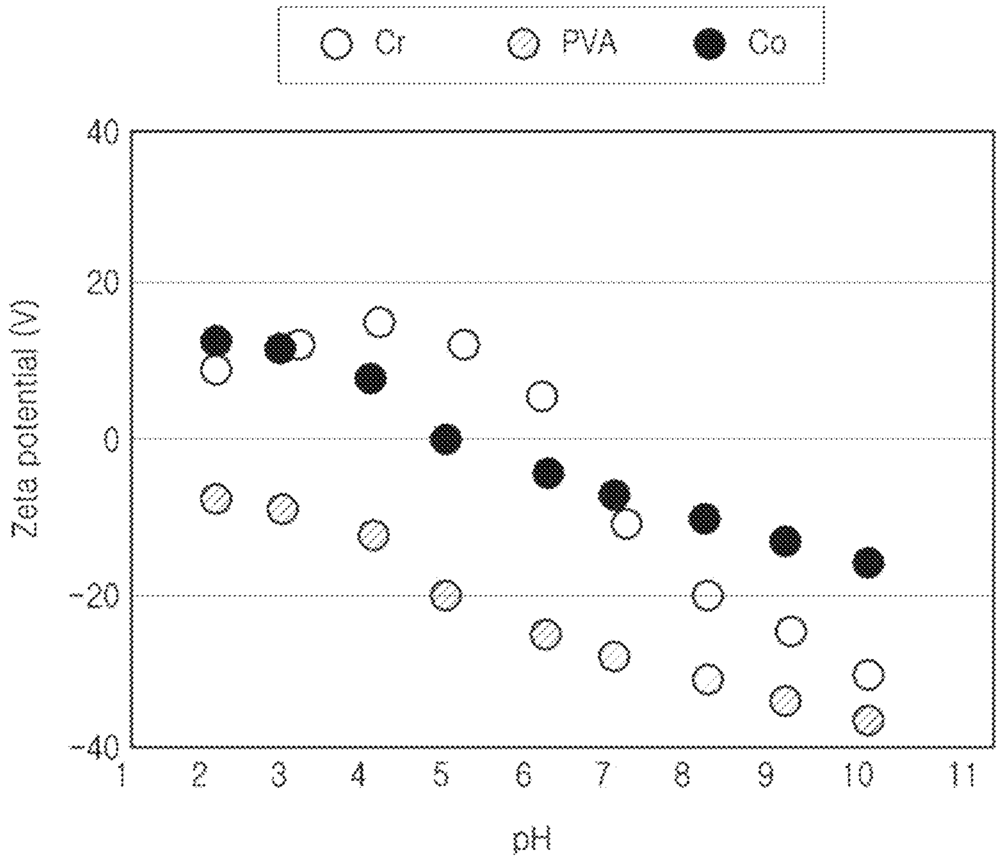
FIG. 4 is a graph illustrating a difference in zeta potential of a slurry residue, a polymer of Comparative Example, and a copolymer of Example.

FIG. 4 is a graph illustrating a difference in a zeta potential of a slurry residue, a polymer of Comparative Example, and a copolymer of Example. FIG. 4 illustrates a change in a zeta potential of ceria (Cr), a polymer of Comparative example (PVA), and a copolymer (Co) of Example according to pH.

Referring to FIG. 4, ceria (Cr) has a zeta potential of (+) polarity at pH 1 to 6, and a zeta potential of (−) polarity at pH 6 to 11.

The polymer (PVA) of Comparative example is a homopolymer containing only polyvinyl alcohol. The polymer (PVA) of Comparative Example has a zeta potential of (−) polarity at pH 1 to 11.

The copolymer (Co) of Example is a block copolymer including 50% by weight of each of polyvinyl alcohol and polyvinylamine. The copolymer (Co) of Example has a zeta potential of (+) polarity at pH 1 to 5, and has a zeta potential of (−) polarity at pH 5 to 11.

For example, under pH conditions (pH 3 to pH 4) of 100-fold diluted hydrofluoric acid (cleaning solution), the polymer (PVA) of Comparative Example and ceria (Cr), a slurry residue, have zeta potentials of different polarities. Accordingly, ceria (Cr) present on a substrate during scrub cleaning may be adsorbed to roll members formed of the polymer (PVA) of Comparative example, thereby contaminating the roll members.

However, under the pH conditions (pH 3 to pH 4) of 100-fold diluted hydrofluoric acid (cleaning solution), the copolymer (Co) and ceria (Cr), which is a slurry residue, have the same zeta potential of the same polarity. Accordingly, contamination of roll members formed of the copolymer (Co), of Example by ceria (Cr) during scrub cleaning may be suppressed.

The type and content of two or more water-soluble polymers for polymerizing the copolymer (Co) of Example is not limited to the above-described example embodiment. The zeta potential of the copolymer may be changed by adjusting the type and/or content of two or more water-soluble polymers according to the type of polishing residue and the type of cleaning solution.

As set forth above, according to example embodiments of inventive concepts, a substrate cleaning apparatus having improved cleaning ability by preventing adsorption of the roll members and a polishing residue, and a substrate cleaning method using the same may be provided.

While example embodiments have been shown and described above, it will be apparent to those skilled in the art that modifications and variations could be made without departing from the scope of inventive concepts as defined by the appended claims. Accordingly, various types of substitution, modification and change will be possible by those skilled in the art within the scope not departing from the technical spirit of inventive concepts described in the claims, and this also falls within the scope of inventive concepts.

What is claimed is:

1. A substrate cleaning apparatus, comprising:

a first roll member including a first roll body extending in a first direction and first protrusions on a surface of the first roll body; and a second roll member including a second roll body extending in the first direction and second protrusions on a surface of the second roll body, wherein the first roll member and the second roll member each include a copolymer of a first water-soluble polymer and a second water-soluble polymer, wherein the second water-soluble polymer comprises a cationic polymer, and the cationic polymer comprises at least one of polyvinylamine, polyethyleneimine, polyvinylimidazole, and polyallylamine.

2. The substrate cleaning apparatus of claim 1, wherein the first water-soluble polymer comprises a non-ionic polymer.

3. The substrate cleaning apparatus of claim 2, wherein the non-ionic polymer comprises at least one of polyvinyl alcohol, polyvinylpyrrolidone, polyethylene glycol, polypropylene glycol, polybutylene glycol, and polyethylene oxide.

4. The substrate cleaning apparatus of claim 1, wherein the copolymer comprises at least one of a random copolymer, an alternating copolymer, a block copolymer, and a graft copolymer.

5. The substrate cleaning apparatus of claim 1, further comprising:

a cleaning solution supply nozzle, wherein the cleaning solution supply nozzle is configured to supply a cleaning solution to a lower surface of a substrate or an upper surface of the substrate when the substrate is positioned between the first roll member and the second roll member.

6. The substrate cleaning apparatus of claim 5, wherein the cleaning solution comprises at least one of pure water (DI water), ultrapure water, hydrofluoric acid (HF), sulfuric acid ($H_3SO_4$), nitric acid ($HNO_3$), phosphoric acid ($H_3PO_4$), a standard clean-1 (SC-1) solution, an EKC solution, a LAL solution, and a diluted sulfate peroxide (DSP) solution.

7. The substrate cleaning apparatus of claim 1, wherein the copolymer has a zeta potential of a same polarity as a slurry residue used in a polishing process at a pH of 5 or less.

8. The substrate cleaning apparatus of claim 7, wherein the slurry residue comprises ceria.

9. A substrate cleaning apparatus, comprising:

a first roll member including a first roll body extending in a first direction and first protrusions on a surface of the first roll body;

a second roll member including a second roll body extending in the first direction and second protrusions on a surface of the second roll body; and a cleaning solution supply nozzle, wherein the cleaning solution supply nozzle is configured to supply a cleaning solution to a lower surface of a substrate or an upper surface of the substrate when the substrate is positioned between the first roll member and the second roll member, and the first roll member and the second roll member each include a copolymer of polyvinyl alcohol and polyvinylamine.

10. The substrate cleaning apparatus of claim 9, wherein the cleaning solution has a pH in a range of 3 to 4.

11. The substrate cleaning apparatus of claim 9, wherein the copolymer has a zeta potential of 0 or more in a pH range of the cleaning solution.

12. The substrate cleaning apparatus of claim 9, wherein a slurry residue used in a polishing process of the substrate has a zeta potential of 0 or more in a pH range of the cleaning solution.

13. The substrate cleaning apparatus of claim 12, wherein the slurry residue comprises ceria.

* * * * *